United States Patent
Mattes et al.

(10) Patent No.: US 7,290,022 B2
(45) Date of Patent: Oct. 30, 2007

(54) METHOD AND FILTER ARRANGEMENT FOR DIGITAL RECURSIVE FILTERING IN THE TIME DOMAIN

(75) Inventors: Heinz Mattes, München (DE); Peter Gregorius, München (DE); Paul Georg Lindt, Donauwörth (DE)

(73) Assignee: Infineon Technologies AG, Munich (DE)

( * ) Notice: Subject to any disclaimer, the term of this patent is extended or adjusted under 35 U.S.C. 154(b) by 743 days.

(21) Appl. No.: 10/714,811

(22) Filed: Nov. 17, 2003

(65) Prior Publication Data

US 2005/0108311 A1    May 19, 2005

(51) Int. Cl.
*G06F 17/10*    (2006.01)
(52) U.S. Cl. ...................................... 708/320
(58) Field of Classification Search ................. 708/320
See application file for complete search history.

(56) References Cited

U.S. PATENT DOCUMENTS

| | | | |
|---|---|---|---|
| 5,089,981 A |  | 2/1992 | Cabot |
| 5,432,723 A | * | 7/1995 | Chen et al. ................. 708/300 |
| 5,523,962 A | * | 6/1996 | Yoshino et al. ............. 708/319 |
| 5,808,924 A |  | 9/1998 | White |
| 6,263,354 B1 | * | 7/2001 | Gandhi ........................ 708/320 |
| 7,096,244 B2 | * | 8/2006 | Yamamoto ................... 708/320 |

OTHER PUBLICATIONS

Fam et al., "Low Roundoff Noise Augmented IIR Filters Based on Normal Realization", IEEE Transactions on Circuits and Systems II: Analog and Digital Signal Processing, New York, US, vol. 8, No. 8, Aug. 1992, pp. 540-548, (9 pages).
Proakis et al., "Digital Signal Processing: Principles, Algorithms, and Applications", Third Edition, Prentice Hall, 1996, pp. 519-539, (21 pages).
Price et al. "Accurate Parallel Form Filter Synthesis", Electronics Letters, vol. 32, No. 22, Oct. 1996, pp. 2066-2067, (2 pages).

* cited by examiner

*Primary Examiner*—D. H. Malzahn
(74) *Attorney, Agent, or Firm*—Maginot, Moore & Beck

(57) ABSTRACT

A method and apparatus for fast digital filtering that requires only filter stages of first and second order. A desired rational filter transfer function is represented as a sum of first and second order intermediate transfer functions. A time dependent input signal is first fed in parallel into a plurality of first and second order intermediate recursive filter stages. Then, the outputs of the intermediate filter stages are summed up to an output filter signal that corresponds to the desired rational filter transfer function. The method and apparatus reduces the amount of calculational effort to the order of O(N), where N denotes the number of sampling points in the time domain, because the digital filtering is based on a discrete recursive convolution in the time domain.

24 Claims, 4 Drawing Sheets

METHOD AND FILTER ARRANGEMENT FOR DIGITAL RECURSIVE FILTERING IN THE TIME DOMAIN

FIELD OF THE INVENTION

Method and filter arrangement for digital recursive filtering in the time domain.

FIELD OF THE INVENTION

The invention relates to a method for digital recursive filtering according to a rational filter transfer function, a filter arrangement for filtering accordingly and corresponding digital filter stages.

BACKGROUND OF THE INVENTION

In digital signal processing, electrical signals are represented by a sequence of binary signals that are to be processed. A major part of this digital processing is done by digital filtering. A binary or digital input signal is put through a digital filter structure that alters the input signal according to its particular filter transfer function and is output as a desired output signal. For instance, a low-pass filter reduces the bandwidth of an input signal.

In most of the cases, the signals in digital signal processing represent time-dependent processes. An input signal $x(t)$ is converted into an output signal $y(t)$ by a filter system which is characterized by its pulse response $h(t)$ or its transfer function, wherein both functions are connected through a Laplace transform: $H(p)=L[h(p)]$. A time-dependent input signal $x(t)$ and the filter output signal $y(t)$ are obtained from the convolution integral of the input signal $x(t)$ with the filter pulse response $h(t)$:

$$y(t) = x(t) * h(t) = \int_{\tau=-\infty}^{t} x(t-\tau)h(\tau)d\tau. \quad \text{(eq. 1)}$$

digital signal processing usually occurs in discrete time steps given by a clock signal, i.e. the values of the time-dependent signals and pulse response are only known at the times $t_n$, and equation 1 reads:

$$y(t_n) = x(t_n) * h(t_n) = \int_{\tau=-\infty}^{t_n} x(t_n-\tau)h(\tau)d\tau. \quad \text{(eq. 2)}$$

Calculating such a convolution integral in the time domain is very elaborate and time-consuming, because the integral has to be approximated by a discrete sum over a number N of samples of the integrand multiplied by the sampling interval. The number of samples N in the integration interval determines the accuracy of the evaluation. The number of complex multiplications that are required for N samples is proportional to $N^2$.

Methods are known to reduce the order of $O(N^2)$ to $O(N \cdot \ln N)$ by using a Fast Fourier Transform. This is described in Numerical Recipes in C: The Art of Scientific Computing, Vol. 8, Press, $2^{nd}$ Edition, Cambridge University Press, 1992. Discrete Fast Fourier Transformation means that the calculations for the convolution are done in the frequency domain and then transformed back into the time domain for obtaining the output signal $y(t_n)$. However, it is favorable to solve the time-dependent problem posed by eq. 2 also in the time domain thereby reducing the amount of calculation force and hence increasing the speed of a digital filter.

Therefore, it is an object of the invention to provide a fast method and filter arrangement for digital filtering an input signal $x(t_n)$ in the time domain that requires a calculational effort which is lower than of the order $O(N \cdot \ln N)$.

DESCRIPTION OF THE INVENTION

This object is met by a method for digital recursive filtering of an input signal according to a rational filter transfer function discussed below and a digital recursive filter arrangement, also discussed below, as well as other embodiments of the invention.

One embodiment of the invention is a method for digital recursive filtering an input signal according to a rational filter transfer function clocked by a clock signal comprising the following steps:

(a) providing first and second order rational functions corresponding to the rational filter transfer function;

wherein the following steps are performed iteratively:

(b1) determining a plurality of intermediate signals from the input signal using the first and second order rational transfer functions and one or more previous intermediate signals determined in a preceding clock cycle of the clock signal;

(b2) adding the plurality of intermediate signals to generate at least one filter output signal wherein the filter output signal corresponds to the rational filter transfer function.

Another embodiment of the invention is a digital recursive filter arrangement for filtering an input signal according to a rational filter transfer function. The digital recursive filter arrangement includes first and second inputs, an interface, one or more first programmable recursive digital filter stages, one or more second programmable recursive digital filter stages, and a summing unit.

The first input receives the input signal. The second input receives a clock signal. The interface is configured to receive filter coefficients from a computation unit, the computation unit defining first and second order rational functions, the first and second order rational functions constituting a partial fraction expansion of the rational filter transfer function, and the computation unit calculating filter coefficients according to the partial fraction expansion. The one or more first programmable recursive digital filter stages of first order are clocked by the clock signal. Each first programmable recursive digital filter stage is operable to determine first intermediate signals from the input signal according to the filter coefficients corresponding to the first order rational functions. The one or more second programmable recursive digital filter stages of second order are also clocked by the clock signal. Each second programmable recursive digital filter stage is operable to determine second intermediate signals from the input signal according to the filter coefficients corresponding to the second order rational functions.

The summing unit is configured to adding the first and second intermediate signals for providing filter output signal at an output, the filter output signal corresponding to the rational filter transfer function.

The idea of the inventive method and filter arrangement for digital filtering is first to provide a representation of the desired filter transfer function $H(p)$ which is the Laplace transform of the filter pulse response $h(t)$, the representation being a partial fraction expansion of the filter transfer function and consists of a sum of only first and second order rational functions.

The digital filtering according to these first and second order rational transfer functions is done in an iterative process and in parallel for each first or second order rational function.

The filter output signal is then obtained by summing up the intermediate signals corresponding to the first and second order rational filter transfer functions.

It is an advantage of the inventive method and filter arrangement that the number of complex multiplications, that need to be performed for providing the filter output at a certain time $t_n$, is only proportional to N. Therefore, the inventive method and filter arrangement reduces the calculational effort to the order of O(N). This is because of the recursive architecture, the current filter output signal corresponding to the time $t_n$ depends on the filter output signal of the preceding clock cycle corresponding to $t_{n-1}$.

Since the basic elements of the filter arrangement are only first and second order recursive filter stages, the required area on a chip and the power consumption is low with respect to prior art filters. Further, any filtering of an input signal according to any desired rational filter transfer function is realized by the inventive method and filter arrangement. Since the inventive method and filter arrangement only resorts to first an second order stages the invention is robust against instabilities that usually arise in higher order filtering.

Therefore, the inventive method and filter arrangement is faster than prior art digital filters, easy to implement on a chip, requires a smaller area on a chip and shows a low power consumption.

In an advantageous embodiment of the invention, the intermediate signals are determined in parallel and at the time for each intermediate signal. Then the first and second filter stages of the inventive digital recursive filter arrangement are connected in parallel. By paralleling the determining the intermediate signals, the inventive filtering becomes very fast and providing the intermediate signals takes only two clock cycles.

In a preferred embodiment of the digital recursive filter arrangement, the computation unit further receives the filter output signal for changing the filter coefficients as a function of the output signal. In this implementation, the inventive filter arrangement is utilized as an adaptive digital filter.

In another preferred embodiment of the inventive digital recursive filter arrangement, the computation unit is replaced by a memory device coupled to the interface for providing the filter coefficients for the first and second filter stages. This has the advantage that if the recursive filter arrangement is used with a fixed filter transfer function, the corresponding filter coefficients can be calculated externally and stored in the memory device. Then the entire filter arrangement becomes less complex and easier to integrate on a chip. The memory device may be a random access memory coupled to a computer, a read-only memory, an erasable read-only memory or any appropriate implementation for storing filter coefficients.

In yet another preferred embodiment of the recursive filter arrangement, there is only one delay element in a signal path between the input and the output of the inventive filter arrangement. This has the advantage that the delay time through the inventive filter arrangement is two clock cycles.

In a preferred embodiment of the first programmable recursive digital filter stages clocked by the clock signal in the inventive filter arrangement, the first filter stages comprise a first multiplier for multiplying the input signal by a first multiplication coefficient and a first adder for adding the output signal of the first multiplier and a recursive signal for providing the intermediate signal wherein the recursive signal is provided by a second adder, a delay element and a second multiplier having a second multiplication coefficient connected in series, said second adder adding the intermediate signal and the output signal of the first multiplier. The multiplication coefficients are programmed according to a recursive convolution in the time domain.

In a preferred embodiment of the second programmable recursive digital filter states clocked by the clock signal of the inventive filter arrangement, the second digital filter stages comprise a first node for receiving the input signal and a first delay element connected between the first node and a second node.

A first adder adds the input signal that is multiplied by a first multiplier having a first multiplication coefficient and the signal from the first delay element wherein the signal from the delay element is multiplied by a second multiplier having a second multiplication coefficient.

A second adder adds the input signal that is multiplied by a third multiplier having a third multiplication coefficient and the signal from the first delay element, said signal from the delay element being multiplied by a fourth multiplier having a fourth multiplication coefficient.

A third adder adds the output signal of the first adder, a first and a second recursive signal for providing a first signal at a third node.

A fourth adder adds the output signal of the second adder, a third and a fourth recursive signal for providing a second signal at a fourth node. A ninth multiplier multiplies a second signal by a ninth multiplication coefficient for providing the intermediate signal.

The first recursive signal is provided by the output signal of a second delay element connected at the fourth node, wherein the output signal of the second delay element is multiplied by a fifth multiplier having a fifth multiplication coefficient.

The second recursive signal is provided by the output signal of a third delay element connected to the third node, wherein the output signal is multiplied by a sixth multiplier having a sixth multiplication coefficient.

The third recursive signal is provided by the output signal of the second delay element, wherein the output signal is multiplied by a seventh multiplier having a seventh multiplication coefficient.

The fourth recursive signal is provided by the output signal of the third delay element, said output signal being multiplied by an eighth multiplier having an eighth multiplication coefficient.

The multiplication coefficients are programmed according to a recursive convolution in the time domain.

In an alternative embodiment of the invention, a digital recursive filter arrangement for filtering an input signal according to a partial fraction expansion representation of a rational filter transfer function, the partial fraction expansion being a sum of first and second order rational functions to be used as first and second intermediate filter transfer functions is provided.

The inventive digital recursive filter arrangement according to the alternative embodiment comprises a first input for receiving the input signal, a second input for receiving a clock signal, first recursive digital filter stages of first order clocked by the clock signal for determining first intermediate signals according to the first order intermediate filter transfer functions from the input signal by means of a discrete recursive convolution in the time domain. It further comprises second recursive digital filter stages of second order clocked by the clock signal for determining second intermediate signals according to the second order intermediate filter transfer functions from the input signal by means of a discrete recursive convolution in the time domain. The inventive filter arrangement further comprises a summing unit for adding the intermediate signals of the first and second filter stages and for providing a filter output signal at an output, the filter output signal corresponding to the rational filter transfer function.

This alternative embodiment of the invention is particularly advantageous for realizing a digital filter for filtering with a fixed transfer function, because the first and second filter stages are implemented accordingly. This alternative embodiment of the invention does not require an interface or computation unit and is easy to implement on a chip.

Further embodiments and preferred implementations of the first and second digital filter stages that may be used in the first and second embodiments described above. Further advantages and embodiments of the invention are subject of the dependent claims as well as the specification with reference to the drawings.

DETAILED DESCRIPTION OF PREFERRED EMBODIMENTS OF THE INVENTION

Recursive Filtering by Means of a Discrete Recursive Convolution in the Time Domain:

First, the inventive method for digital recursive filtering by means of a recursive convolution in the time domain is presented with respect to first and second order filter transfer functions.

If the pulse response h(t) can be written in terms of an exponential function $$h(t)=h_o e^{\lambda t}, \quad (eq.\ 3)$$

the convolution integral of eq. 2 can be split in partial integrals corresponding to integrations of time intervals $\Delta t = t_n - t_{n-1}$. Indeed, pulse responses corresponding to rational filter transfer functions H(p) can always be expressed according to eq. 3 as it is explained below.

Exploiting the particular form of the response h(t) eq. 2 can be written as:

$$y(t_n) = y(t_{n-1})e^{\lambda \Delta t} + h_0 e^{\lambda \Delta t} \int_{\tau=t_{n-1}}^{t_n} x(\tau)e^{\lambda(t_{n-1}-\tau)}\,d\tau. \quad (eq.\ 4)$$

Using the well-known trapezoid rule for approximately evaluating the remaining integral, one obtains the following recursion formula:

$$y(t_n) = \left(y(t_{n-1}) + \frac{h_0 \Delta t}{2}x(t_{n-1})\right)e^{\lambda \Delta t} + \frac{h_0 \Delta t}{2}x(t_n). \quad (eq.\ 5)$$

Eq. 5 provides for a recursive calculation of the convolution according to eq. 2, if the pulse response has a representation in terms of exponential functions. Instead of evaluating an integral over the entire time passed—as it is required usually—only simple multiplications need to be performed.

First Order Recursive Filtering:

A transfer function having a single real pole is written as:

$$H(p) = \frac{h_0}{p - \sigma_0}, \quad (eq.\ 6)$$

and leads to the corresponding pulse response h(t) by an inverse Laplace transform:

$$h(t)=L^{-1}[H(p)]=h_0 e^{\sigma_0 t}. \quad (eq.\ 7)$$

In the case of the first order filter transfer function, eq. 5 can immediately be employed.

Figure 1:
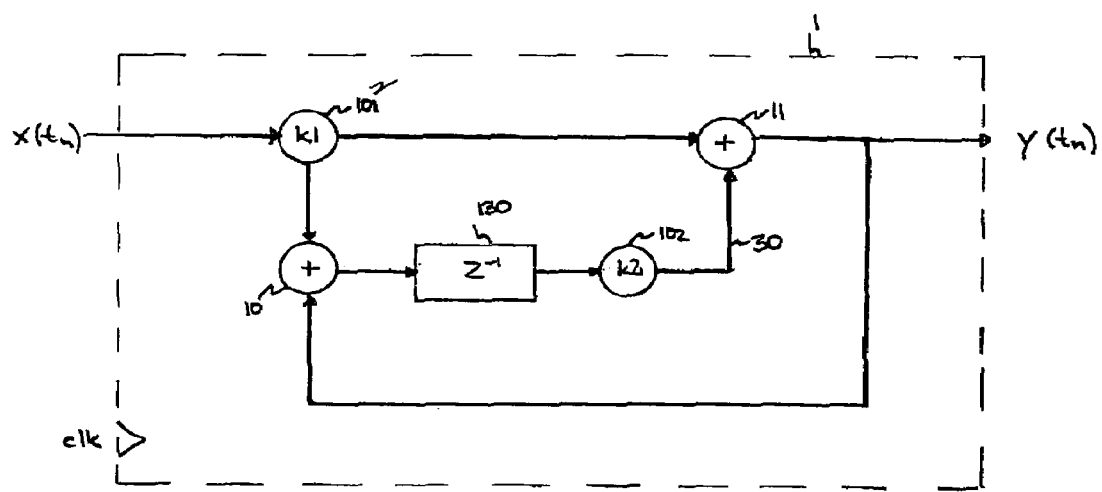
FIG. 1: an inventive digital recursive filter stage of first order.

FIG. 1 shows a digital filter stage 1 of first order. The filter stage realizes eq. 5 for the first order transfer function of eq. 6.

The filter stage 1 comprises a first multiplier 101 for multiplying the input signal $x(t_n)$ by a first multiplication coefficient k1, a first adder 11 for adding the output signal of the first multiplier 101 and a recursive signal 30 for providing the filter output signal $y(t_n)$.

The recursive signal 30 is provided by a second adder 10, a delay element 130 and a second multiplier 102 having a second multiplication coefficient k2 connected in series, wherein the second adder 10 adds the filter output signal $y(t_n)$ and the output signal of the first multiplier 101.

According to eq. 5, the filter coefficients k1 and k2 read:

$$k1 = \frac{h_0 \Delta t}{2} \text{ and } k2 = e^{\sigma_0 \Delta t}. \quad (eq.\ 8)$$

The adders, multipliers and the delay element, which is preferably a memory element, are all clocked by the clock signal clk.

Hence, without doing elaborate convolution integrals in the time domain or resorting to Fast Fourier transforms, the output signal $y(t_n)$ is provided within two clock cycles due to of the memory cell storing the output signal $y(t_{n-1})$ of the preceding clock cycle.

Second Order Recursive Filtering:

By way of example, a filter transfer function H(p) having a pair of complex conjugate poles is considered:

$$H(p) = \frac{a_0 + a_1 p}{(p - (\sigma_0 + j\omega_0))(p - (\sigma_0 - j\omega_0))}, \quad (eq.\ 9)$$

where the symbol j denotes the imaginary $j^2 = -1$.

The transfer function has a pulse response:

$$h(t) = L^{-1}[H(p)] = \frac{X}{2\omega_0}e^{\lambda t} + \frac{X^*}{2\omega_0}e^{\lambda^* t}; \; X = a_1\omega_0 - j(a_0 + a_1\sigma_0). \quad \text{(eq. 10)}$$

The two poles occur at $\lambda = \sigma_0 \pm j\omega_0$. Along the lines of eq. 5, one obtains now two recursion relations because of the imaginary and real parts $y^{(R)}(t_n)$ and $y^{(I)}(t_n)$. The recursion relations corresponding to the first pole can be written in a compact form in terms of matrices:

$$\begin{pmatrix} y^{(R)}(t_n) \\ y^{(I)}(t_n) \end{pmatrix} = \begin{pmatrix} k11 & k12 \\ k13 & k14 \end{pmatrix} \begin{pmatrix} y^{(R)}(t_{n-1}) \\ y^{(I)}(t_{n-1}) \end{pmatrix} + \begin{pmatrix} k21 & k22 \\ k23 & k24 \end{pmatrix} \begin{pmatrix} x(t_{n-1}) \\ x(t_n) \end{pmatrix}, \quad \text{(eq. 11)}$$

where the matrix coefficients read as follows:

$$k11 = \cos(\omega_0 \Delta t) e^{\sigma_0 \Delta t} \quad \text{(eq. 12)}$$

$$k12 = -\sin(\omega_0 \Delta t) e^{\sigma_0 \Delta t}$$

$$k13 = \sin(\omega_0 \Delta t) e^{\sigma_0 \Delta t}$$

$$k14 = \cos(\omega_0 \Delta t) e^{\sigma_0 \Delta t}$$

$$k21 = \frac{\Delta t}{4} e^{\sigma_0 \Delta t} \left( \left( \frac{a_0}{\omega_0} + \frac{a_1 \sigma_0}{\omega_0} \right) \sin(\omega_0 \Delta t) + a_1 \cos(\omega_0 \Delta t) \right)$$

$$k22 = \frac{a_1 \Delta t}{4}$$

$$k23 = \frac{\Delta t}{4} e^{\sigma_0 \Delta t} \left( -\left( \frac{a_0}{\omega_0} + \frac{a_1 \sigma_0}{\omega_0} \right) \cos(\omega_0 \Delta t) + a_1 \sin(\omega_0 \Delta t) \right)$$

$$k24 = -\frac{\Delta t}{4} \left( \frac{a_0}{\omega_0} + \frac{a_1 \sigma_0}{\omega_0} \right)$$

An analog recursion relation is derived for the second pole. The requirement of a real output signal leads to the actual physical filter output $y(t_n) = 2 y^{(R)}(t_n)$.

Figure 2:
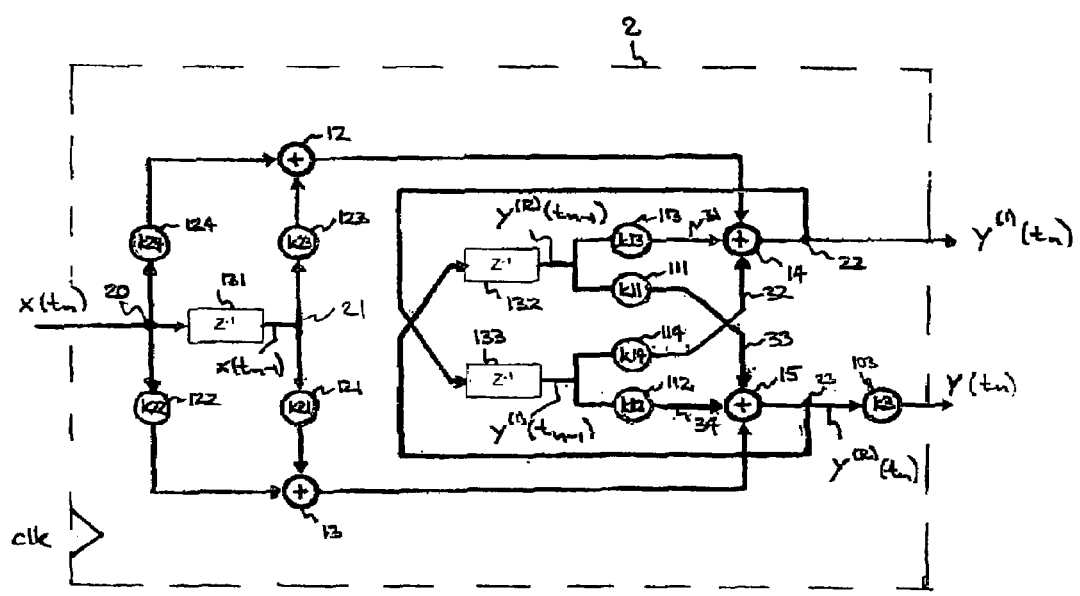
FIG. 2: an inventive digital recursive filter stage of second order.

FIG. 2 shows a preferred embodiment of a digital filter stage 2 of second order for filtering according to the recursive convolution in the time domain for a transfer function corresponding to eq. 9.

The digital filter stage 2 comprises a first node 20 for receiving the input signal $x(t_n)$, a first delay element 131, which is preferably a memory cell, connected between the first node 20 and a second node 21.

A first adder 12 adds the input signal $x(t_n)$ that is multiplied by a first multiplier 124 having a first multiplication coefficient k24 and the signal $x(t_{n-1})$ from the first delay element 131, wherein the delayed signal $x(t_{n-1})$ is multiplied by a second multiplier 123 having a second multiplication coefficient k23.

A second adder 13 adds the input signal $x(t_n)$ that is multiplied by a third multiplier 122 having a third multiplication coefficient k22 and the signal $x(t_{n-1})$ from the first delay element 131, wherein the delayed signal $x(t_{n-1})$ is multiplied by a fourth multiplier 121 having a fourth multiplication coefficient k21.

A third adder 14 adds the output signal of the first adder 12, a first and a second recursive signal 31, 32 for providing a first signal $y^{(I)}(t_n)$ at a third node 22.

A fourth adder 15 adds the output signal of the second adder 13, a third and a fourth recursive signal 33, 34 for providing a second signal $y^{(R)}(t_n)$ at a fourth node 23.

A ninth multiplier 103 for multiplying the second signal $y^{(R)}(t_n)$ by a ninth multiplication coefficient k3 for providing the filter output signal $y(t_n)$.

The first recursive signal 31 is provided by the output signal $y^{(R)}(t_{n-1})$ of a second delay element 132 connected at the fourth node 23, wherein the output signal $y^{(R)}(t_{n-1})$ is multiplied by a fifth multiplier 113 having a fifth multiplication coefficient k13.

The second recursive signal 32 is provided by the output signal $y^{(I)}(t_{n-1})$ of a third delay element 133 connected to the third node 22, wherein the output signal $y^{(I)}(t_{n-1})$ is multiplied by a sixth multiplier 114 having a sixth multiplication coefficient k14.

The third recursive signal 33 is provided by the output signal $y^{(R)}(t_{n-1})$ of the second delay element 132, wherein the output signal $y^{(R)}(t_{n-1})$ is multiplied by a seventh multiplier 111 having a seventh multiplication coefficient k11.

The fourth recursive signal 34 is provided by the output signal $y^{(I)}(t_{n-1})$ of the third delay element 132, wherein the output signal $y^{(I)}(t_{n-1})$ is multiplied by an eighth multiplier 112 having an eighth multiplication coefficient k12.

All the delay elements, adders and multipliers are clocked by a clock signal clk.

The multiplication coefficients or filter coefficients, respectively, are given by the matrix elements of eq. 12 and k3=2. Should poles occur in a pulse response that are not pairs of complex conjugate the inventive method still prescribes recursion relations. As a remedy for such poles also slight de-tuning of the filter to cancel the poles is an option.

The preferred embodiment of a second order recursive digital filter stage provides in two clock cycles the filter output signal $y(t_n)$.

Higher Order Recursive Filtering and Filter:

In general, rational functions that are ratios of two polynomials P(p) and Q(p) can always be written as a sum of first and second order rational functions by means of a partial fraction expansion.

Therefore, any desired rational filter transfer function may be expressed as a sum of first and second order rational filter functions according to eq. 6 and eq. 9. Hence, the digital filtering according to a rational transfer function is done in parallel by units of filter stages according to the invention. The filter stages of first and second order then perform in parallel in accordance with the recursive convolution in the time domain fast digital filtering.

Figure 3:
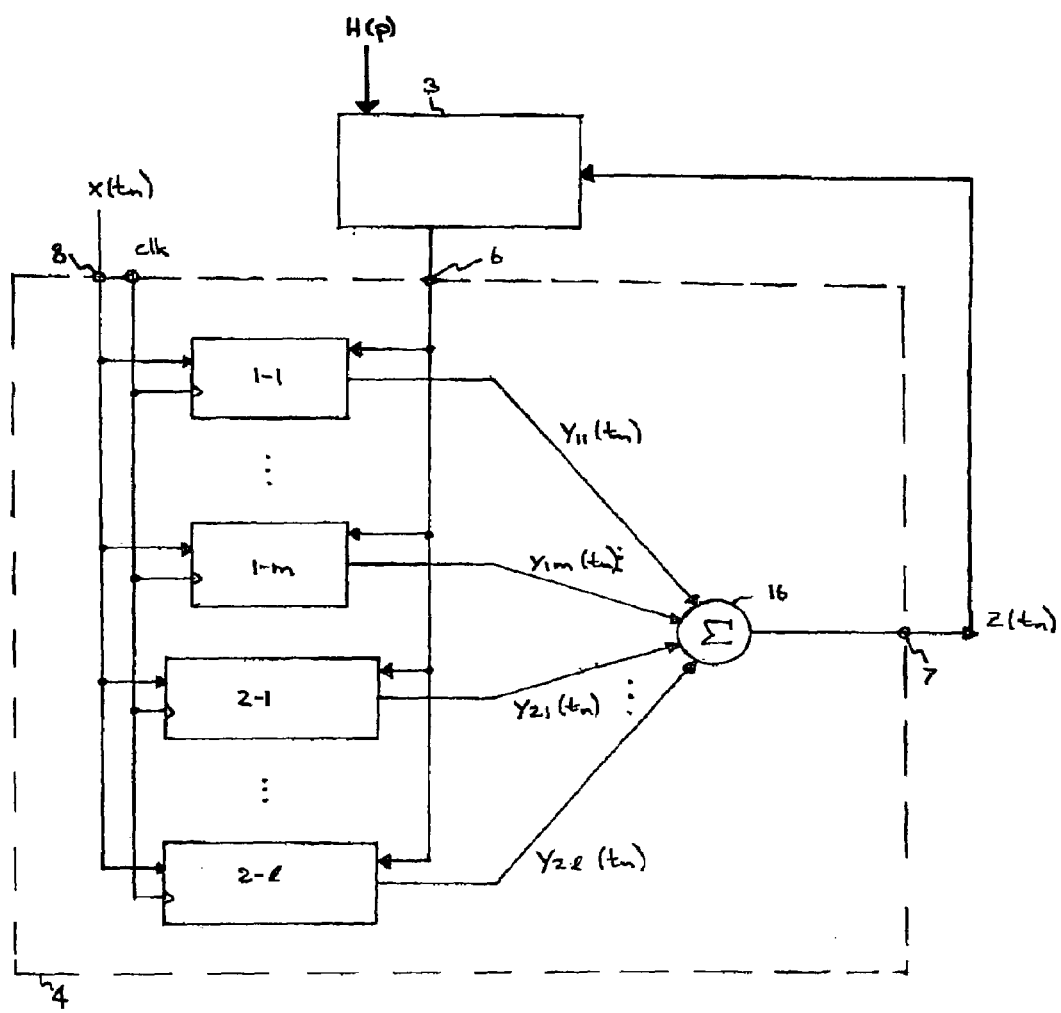
FIG. 3: a preferred embodiment of the digital recursive filter arrangement according to the invention.

FIG. 3 shows an inventive digital recursive filter arrangement 4 for filtering an input signal $x(t_n)$ according to a rational filter transfer function H(p). The filter arrangement comprises a first input 8 for receiving the input signal $x(t_n)$, a second input for receiving a clock signal clk, an interface 6 for receiving filter coefficients from a computation unit 3.

The computation unit 3 performs a partial fraction expansion of the desired rational filter transfer function H(p) and provides a sum of first and second order rational filter functions which are used as first and second order intermediate filter transfer functions for the inventive first and second order filter stages. The computation unit may be coupled to external control circuitry, a user interface or other means that provide H(p) for receiving the desired rational filter transfer function H(p). The computation unit 3 also calculates the filter coefficients, or multiplication coefficients respectively, according to the partial fraction expansion and a recursive convolution in the time domain.

The filter arrangement further comprises a plurality of first programmable recursive digital filter stages of first order 1-1, ... 1-m which are clocked by the clock signal clk. The first programmable recursive digital filter stages receive the input signal $x(t_n)$ and output first intermediate signals $y_{11}(t_n)$, ... $y_{1m}(t_n)$ according to the filter coefficients provided by the computation unit 3.

The computation unit 3 may comprise ordinary processing elements including a memory, or may be embodied primarily as a memory that generates filter coefficients using a look-up table or the like.

A second plurality of programmable recursive digital filter stages of second order 2-1, ... 2-1 clocked by the clock signal also receive the input signal $x(t_n)$. The second order filter stages output second intermediate signals $y_{21}(t_n)$, ... $y_{21}(t_n)$ according to the filter coefficients provided by the computational unit 3 according to a recursive convolution in the time domain.

A summing unit 16 adds all the intermediate signals $y_{11}(t_n)$, ... $y_{1m}(t_n)$, $y_{21}(t_n)$, ... $y_{21}(t_n)$ of the first and second filter stages 1-1, ... 1-m, 2-1, ... 2-1 and provides the filter output signal $z(t_n)$ at the output 7.

The filter output signal $z(t_n)$ corresponds to the rational filter transfer function H(p).

The output 7 is also coupled to the computation unit 3 such that the computation unit 3 changes the filter coefficients as a function of the output signal. Hence, the inventive digital recursive filter arrangement works as an adaptive filter.

Figure 4:
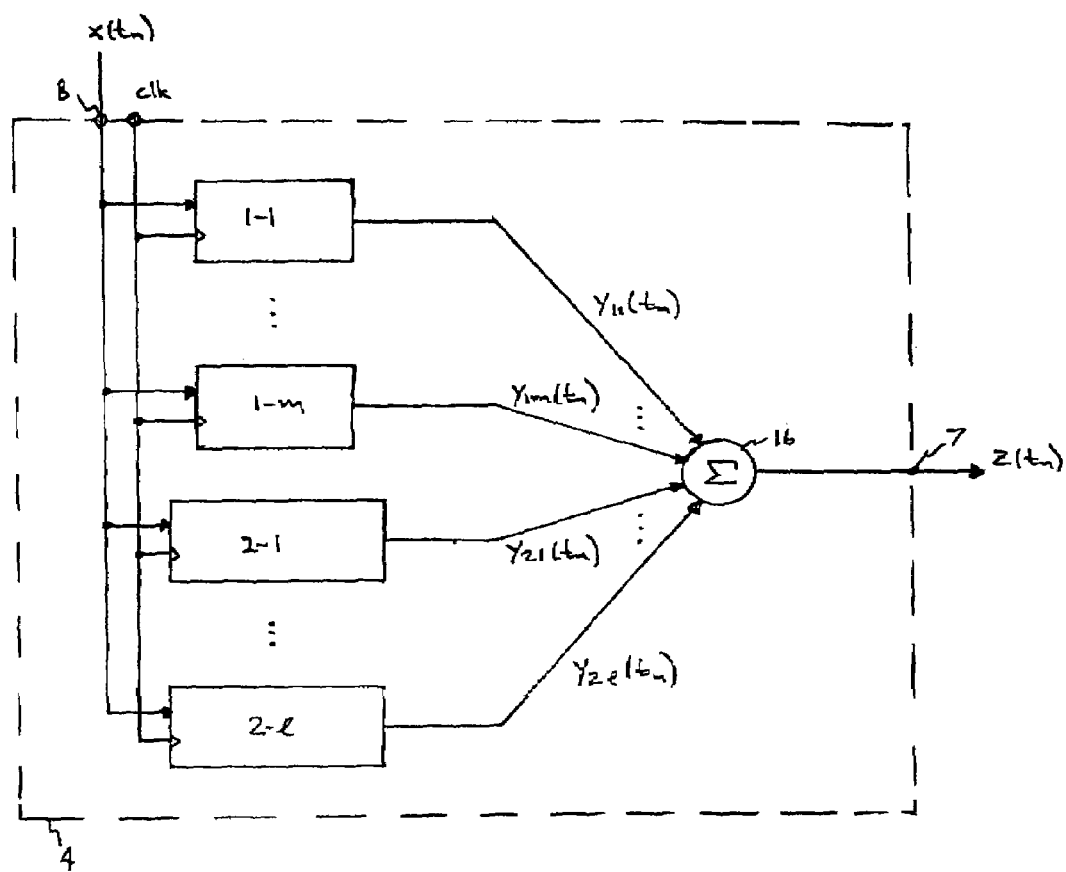
FIG. 4: an alternative embodiment of the digital recursive filter arrangement according to the invention.

FIG. 4 shows an alternative embodiment of the digital recursive filter arrangement 4 for filtering an input signal $x(t_n)$ according to a partial fraction expansion representation of a rational filter transfer function H(p).

The partial fraction expansion consists of a sum of first and second order rational functions which are used as first and second order intermediate filter transfer functions.

The alternative embodiment comprises a first input 8 for receiving the input signal $x(t_n)$, a second input for receiving the clock signal clk, first and second recursive digital filter stages 1-1, ... 1-m, 2-1, ... 2-e and a summing unit 16.

The first recursive digital filter stages 1-1, ... 1-m are of first order and clocked by the clock signal clk and determine the first intermediate signal $y_{11}(t_n)$, ... $y_{1m}(t_n)$ according to the first or intermediate filter transfer functions from the input signal $x(t_n)$ by means of a discrete recursive convolution in the time domain.

The second digital filter stages 2-1, ... 2-1 are of second order and clocked by the clock signal clk. The second filter stages determine the second intermediate signals $y_{21}(t_n)$, ... $y_{21}(t_n)$ according to the second order intermediate filter transfer functions from the input signal $x(t_n)$ by means of a discrete recursive convolution in the time domain.

The summing unit 16 adds all the intermediate signals $y_{11}(t_n)$, ... $y_{1m}(t_n)$, $y_{21}(t_n)$, ... $y_{21(m)}$ of the first and second filter stages 1-1, ... 1-n, 2-1, ... 2-1 and provides the filter output signal $z(t_n)$ at the output 7. The filter outputs signal $z(t_n)$ corresponds to the rational filter transfer function H(p).

Although the invention has been described in terms of particular structures, devices and methods, those skilled in the art will understand based on the description herein that it is not limited merely to the subject examples and that the full scale of the invention is properly determined by the claims that follow.

REFERENCE SIGNS:

1, 1-1, ... 1-m filter stages of first order
2, 2-1, ... 2-l filter stages of second order
3 computation unit
4 digital filter arrangement
6 interface
7 output node
8 input node
10-16 adder
101, 102, 103 multipliers
111-114 multipliers
121-124 multipliers
clk clock signal
$x(t_n)$ input signal at clock time $t_n$
$Z^{-1}$, 130-133 delay element
20, 21, 22, 23 nodes
30-33 recursive signals
k1, ..., k24 multiplication coefficients

The invention claimed is:

1. A digital filter stage of first order for filtering an input signal and providing a filter output signal comprising:
   a first multiplier operable to multiply the input signal by a first multiplication coefficient;
   a first adder operable to add the output signal of the first multiplier and a recursive signal and provide the filter output signal;
   a combination of a second adder, a delay element and a second multiplier having a second multiplication coefficient connected in series, said second adder adding the filter output signal and the output signal of the first multiplier to generate a second adder output, the delay element delaying the second adder output, the second multiplier receiving the delayed second adder output and generating the recursive signal therefrom.

2. The digital filter stage of claim 1, wherein the multiplication coefficients correspond to a recursive convolution in the time domain.

3. The digital filter stage of claim 1, wherein the multiplication coefficients are programmable.

4. The digital filter stage of claim 1, wherein the delay elements comprise memory cells.

5. The digital filter stage of claim 1, wherein the delay elements, multipliers and adders are clocked by a clock signal.

6. A digital filter stage of second order for filtering an input signal and providing a filter output signal comprising:
   a first node for receiving the input signal;
   a first delay element connected between the first node and a second node;
   a first adder for adding the input signal that is multiplied by a first multiplier having a first multiplication coefficient and the signal from the first delay element said signal being multiplied by a second multiplier having a second multiplication coefficient;
   a second adder for adding the input signal that is multiplied by a third multiplier having a third multiplication coefficient and the signal from the first delay element said signal being multiplied by a fourth multiplier having a fourth multiplication coefficient;
   a third adder for adding the output signal of the first adder, a first and a second recursive signal for providing a first signal at a third node;
   a fourth adder for adding the output signal of the second adder, a third and a fourth recursive signal for providing a second signal at a fourth node; and a ninth multiplier for multiplying the second signal by a ninth multiplication coefficient for providing the filter output signal;

wherein:

the first recursive signal is provided by the output signal of a second delay element connected at the fourth node, said output signal being multiplied by a fifth multiplier having a fifth multiplication coefficient;

the second recursive signal is provided by the output signal of a third delay element connected to the third node, said output signal being multiplied by a sixth multiplier having a sixth multiplication coefficient;

the third recursive signal is provided by the output signal of the second delay element said output signal being multiplied by a seventh multiplier having a seventh multiplication coefficient; and the fourth recursive signal is provided by the output signal of the third delay element said output signal being multiplied by an eighth multiplier having an eighth multiplication coefficient.

7. The digital filter stage of claim 6, wherein the multiplication coefficients correspond to a recursive convolution in the time domain.

8. The digital filter stage of claim 6, wherein the multiplication coefficients are programmable.

9. The digital filter stage of claim 6, wherein the delay elements comprise memory cells.

10. The digital filter stage of claim 6, wherein the delay elements, multipliers and adders are clocked by a clock signal.

11. A digital recursive filter arrangement for filtering an input signal according to a partial fraction expansion representation of a rational filter transfer function, the partial fraction expansion being a sum of first and second order rational functions to be used as first and second order intermediate filter transfer functions, the arrangement comprising:

(a) a first input for receiving the input signal;

(b) a second input for receiving a clock signal;

(c) one or more first recursive digital filter stages of first order clocked by the clock signal, the one or more first recursive digital filter stages configured to determine first intermediate signals according to the first order intermediate filter transfer functions from the input signal using a discrete recursive convolution in the time domain;

(d) one or more second recursive digital filter stages of second order clocked by the clock signal, the one or more second recursive digital filter stages configured to determine second intermediate signals according to the second order intermediate filter transfer functions from the input signal using a second discrete recursive convolution in the time domain;

(e) a summing unit operably coupled to add the intermediate signals of the first and second filter stages and provide a filter output signal at an output, the filter output signal corresponding to the rational filter transfer function;

wherein each of the first recursive digital filter stages clocked by the clock signal comprises:

a first multiplier for multiplying the input signal by a first multiplication coefficient;

a first adder for adding the output signal of the first multiplier and a recursive signal for providing the intermediate signal;

wherein the recursive signal is provided by a second adder, a delay element and a second multiplier having a second multiplication coefficient connected in series, said second adder adding the intermediate signal and the output signal of the first multiplier; and wherein the multiplication coefficients are programmed according to a recursive convolution in the time domain.

12. A digital recursive filter arrangement for filtering an input signal according to a partial fraction expansion representation of a rational filter transfer function, the partial fraction expansion being a sum of first and second order rational functions to be used as first and second order intermediate filter transfer functions, the arrangement comprising:

(a) a first input for receiving the input signal;

(b) a second input for receiving a clock signal;

(c) one or more first recursive digital filter stages of first order clocked by the clock signal, the one or more first recursive digital filter stages configured to determine first intermediate signals according to the first order intermediate filter transfer functions from the input signal using a discrete recursive convolution in the time domain;

(d) one or more second recursive digital filter stages of second order clocked by the clock signal, the one or more second recursive digital filter stages configured to determine second intermediate signals according to the second order intermediate filter transfer functions from the input signal using a second discrete recursive convolution in the time domain;

(e) a summing unit operably coupled to add the intermediate signals of the first and second filter stages and provide a filter output signal at an output, the filter output signal corresponding to the rational filter transfer function;

wherein each of the first recursive digital filter stages clocked by the clock signal comprises:

a first node for receiving the input signal;

a first delay element connected between the first node and a second node;

a first adder for adding the input signal that is multiplied by a first multiplier having a first multiplication coefficient and the signal from the first delay element said signal being multiplied by a second multiplier having a second multiplication coefficient;

a second adder for adding the input signal that is multiplied by a third multiplier having a third multiplication coefficient and the signal from the first delay element said signal being multiplied by a fourth multiplier having a fourth multiplication coefficientl;

a third adder for adding the output signal of the first adder, a first and a second recursive signal for providing a first signal at a third node;

a fourth adder for adding the output signal of the second adder, a third and a fourth recursive signal for providing a second signal at a fourth node; and a ninth multiplier for multiplying the second signal by a ninth multiplication coefficient for providing the intermediate signal;

wherein:

the first recursive signal is provided by the output signal of a second delay element connected at the fourth node, said output signal being multiplied by a fifth multiplier having a fifth multiplication coefficient;

the second recursive signal is provided by the output signal of a third delay element connected to the third node, said output signal being multiplied by a sixth multiplier having a sixth multiplication coefficient;

the third recursive signal is provided by the output signal of the second delay element said output signal being multiplied by a seventh multiplier having a seventh multiplication coefficient; and the fourth recursive signal is provided by the output signal of the third delay element said output signal being multiplied by an eighth multiplier having an eighth multiplication coefficient; and wherein the multiplication coefficients are programmed according to a recursive convolution in the time domain.

13. A digital recursive filter arrangement for filtering an input signal according to a rational filter transfer function comprising:

(a) a first input for receiving the input signal;

(b) a second input for receiving a clock signal;

(c) an interface configured to receive filter coefficients from a computation unit, the computation unit defining first and second order rational functions, the first and second order rational functions constituting a partial fraction expansion of the rational filter transfer function, and the computation unit calculating filter coefficients according to the partial fraction expansion;

(d) one or more first programmable recursive digital filter stages of first order clocked by the clock signal, each first programmable recursive digital filter stage operable to determine first intermediate signals from the input signal according to the filter coefficients corresponding to the first order rational functions;

(e) one or more second programmable recursive digital filter stages of second order clocked by the clock signal, each second programmable recursive digital filter stage operable to determine second intermediate signals from the input signal according to the filter coefficients corresponding to the second order rational functions;

(f) a summing unit configured to adding the first and second intermediate signals for providing filter output signal at an output, the filter output signal corresponding to the rational filter transfer function;

wherein each of the first programmable recursive digital filter stages clocked by the clock signal comprises:

a first multiplier for multiplying the input signal by a first multiplication coefficient;

a first adder for adding the output signal of the first multiplier and a recursive signal for providing the intermediate signal;

wherein the recursive signal is provided by a second adder, a delay element and a second multiplier having a second multiplication coefficient connected in series, said second adder adding the intermediate signal and the output signal of the first multiplier; and wherein the multiplication coefficients are programmed according to a recursive convolution in the time domain.

14. The digital recursive filter arrangement of claim 13, wherein the first and second programmable recursive digital filter stages are connected in parallel.

15. The digital recursive filter arrangement of claim 13, wherein the computation unit further receives the filter output signal, the computation unit operable to determine new filter coefficients as a function of the output signal.

16. The digital recursive filter arrangement of claim 13, wherein the computation unit comprises a memory device coupled to the interface for providing the filter coefficients for the first and second programmable recursive digital filter stages.

17. The digital recursive filter arrangement of claim 13, wherein the first and second first programmable recursive digital filter stages and the summing unit cooperate to generate the filter output signal in two clock cycles.

18. The digital recursive filter arrangement of claim 13, further comprising one delay element in a signal path between the input and the output.

19. A digital recursive filter arrangement for filtering an input signal according to a rational filter transfer function comprising:

(a) a first input for receiving the input signal;

(b) a second input for receiving a clock signal;

(c) an interface configured to receive filter coefficients from a computation unit, the computation unit defining first and second order rational functions, the first and second order rational functions constituting a partial fraction expansion of the rational filter transfer function, and the computation unit calculating filter coefficients according to the partial fraction expansion;

(d) one or more first programmable recursive digital filter stages of first order clocked by the clock signal, each first programmable recursive digital filter stage operable to determine first intermediate signals from the input signal according to the filter coefficients corresponding to the first order rational functions;

(e) one or more second programmable recursive digital filter stages of second order clocked by the clock signal, each second programmable recursive digital filter stage operable to determine second intermediate signals from the input signal according to the filter coefficients corresponding to the second order rational functions;

(f) a summing unit configured to adding the first and second intermediate signals for providing filter output signal at an output, the filter output signal corresponding to the rational filter transfer function;

wherein each of the second programmable recursive digital filter stages clocked by the clock signal comprises:

a first node for receiving the input signal;

a first delay element connected between the first node and a second node;

a first adder for adding the input signal that is multiplied by a first multiplier having a first multiplication coefficient and the signal from the first delay element said signal being multiplied by a second multiplier having a second multiplication coefficient;

a second adder for adding the input signal that is multiplied by a third multiplier having a third multiplication coefficient and the signal from the first delay element said signal being multiplied by a fourth multiplier having a fourth multiplication coefficient;

a third adder for adding the output signal of the first adder, a first and a second recursive signal for providing a first signal at a third node;

a fourth adder for adding the output signal of the second adder, a third and a fourth recursive signal for providing a second signal at a fourth node; and a ninth multiplier for multiplying the second signal by a ninth multiplication coefficient for providing the intermediate signal;

wherein:
the first recursive signal is provided by the output signal of a second delay element connected at the fourth node, said output signal being multiplied by a fifth multiplier having a fifth multiplication coefficient;
the second recursive signal is provided by the output signal of a third delay element connected to the third node, said output signal being multiplied by a sixth multiplier having a sixth multiplication coefficient;
the third recursive signal is provided by the output signal of the second delay element said output signal being multiplied by a seventh multiplier having a seventh multiplication coefficient; and
the fourth recursive signal is provided by the output signal of the third delay element said output signal being multiplied by an eighth multiplier having an eighth multiplication coefficient; and
wherein the multiplication coefficients are programmed according to a recursive convolution in the time domain.

20. The digital recursive filter arrangement of claim 19, wherein the first and second programmable recursive digital filter stages are connected in parallel.

21. The digital recursive filter arrangement of claim 19, wherein the computation unit further receives the filter output signal, the computation unit operable to determine new filter coefficients as a function of the output signal.

22. The digital recursive filter arrangement of claim 19, wherein the computation unit comprises a memory device coupled to the interface for providing the filter coefficients for the first and second programmable recursive digital filter stages.

23. The digital recursive filter arrangement of claim 19, wherein the first and second first programmable recursive digital filter stages and the summing unit cooperate to generate the filter output signal in two clock cycles.

24. The digital recursive filter arrangement of claim 19, further comprising one delay element in a signal path between the input and the output.

* * * * *